(12) United States Patent
Ma

(10) Patent No.: US 7,517,229 B2
(45) Date of Patent: Apr. 14, 2009

(54) LGA SOCKET ASSEMBLY HAVING IMPROVED PICKUP CAP TO BE EJECTED WHEN A LEVER IS LIFTED

(75) Inventor: Hao-Yun Ma, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/894,125

(22) Filed: Aug. 20, 2007

(65) Prior Publication Data

US 2008/0045048 A1 Feb. 21, 2008

(30) Foreign Application Priority Data

Aug. 18, 2006 (CN) .................. 2006 2 0077168

(51) Int. Cl.
*H01R 12/00* (2006.01)

(52) U.S. Cl. .................. 439/73; 439/331; 439/940

(58) Field of Classification Search .................. 439/73, 439/331, 940

See application file for complete search history.

(56) References Cited

U.S. PATENT DOCUMENTS

| | | | |
|---|---|---|---|
| 6,877,990 B2 * | 4/2005 | Liao et al. | 439/41 |
| 6,899,553 B2 * | 5/2005 | Ma et al. | 439/135 |
| 6,905,353 B2 * | 6/2005 | Ma et al. | 439/135 |
| 6,971,890 B2 * | 12/2005 | Ma | 439/135 |
| 6,971,902 B2 * | 12/2005 | Taylor et al. | 439/342 |
| 7,004,768 B2 * | 2/2006 | Ma et al. | 439/135 |
| 7,029,295 B2 * | 4/2006 | Liao | 439/135 |
| 7,033,188 B2 * | 4/2006 | Ma | 439/135 |
| 7,059,863 B2 * | 6/2006 | Ma | 439/41 |
| 7,070,428 B2 * | 7/2006 | Ma | 439/135 |
| 7,090,517 B2 * | 8/2006 | Ma | 439/135 |
| 7,112,066 B2 * | 9/2006 | Liao et al. | 439/41 |
| 7,140,890 B1 * | 11/2006 | Ju | 439/135 |
| 7,147,508 B1 * | 12/2006 | Ju | 439/521 |
| 7,165,988 B2 * | 1/2007 | Ma et al. | 439/331 |
| 7,264,487 B2 * | 9/2007 | Liao | 439/135 |
| 2004/0266245 A1 * | 12/2004 | Liao | 439/331 |
| 2005/0014411 A1 * | 1/2005 | Ma | 439/331 |
| 2006/0116015 A1 * | 6/2006 | Ju | 439/331 |
| 2007/0054532 A1 * | 3/2007 | Ho | 439/331 |
| 2008/0153323 A1 * | 6/2008 | Ju et al. | 439/73 |
| 2008/0160814 A1 * | 7/2008 | Howell | 439/331 |

\* cited by examiner

*Primary Examiner*—Ross N Gushi
(74) *Attorney, Agent, or Firm*—Wei Te Chung

(57) ABSTRACT

A land grid array socket comprises an insulative housing having a plurality of contacts. The insulative housing has a top surface for receiving a land grid array package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing. A pickup cap is attached to the clip, and includes an ejection arrangement interfering with operation of the lever such that when the lever is released from a locked position, the pickup cap can be smoothly ejected by the engagement between the ejection arrangement and the lever.

12 Claims, 6 Drawing Sheets

LGA SOCKET ASSEMBLY HAVING IMPROVED PICKUP CAP TO BE EJECTED WHEN A LEVER IS LIFTED

FIELD OF THE INVENTION

The present invention relates to a LGA socket, and more particularly, to a LGA socket having improved pickup which can be ejected from the socket when a lever thereof is lifted.

DESCRIPTION OF PRIOR ART

U.S. Pat. No. 7,001,197 issued to Shirai on Feb. 21, 2006 discloses a typical type of LGA socket. As clearly shown in Figures, the socket generally includes a metal reinforcing plate with a housing securely supported therein. Then a metal clip is pivotally assembled to the reinforcing plate. On the other hand, a clip is pivotally assembled to the other side of the reinforcing plate and when the clip is closed to the reinforcing plate, the lever having a cam can lock the clip to a closed position. For easy surface-mount operation, i.e. pick-and-place done by an automatic robot, a pickup cap is arranged, see FIG. 24A along with its description. As shown in FIG. 24A, the pickup cap 560 is securely attached to the housing, and has its top portion protrudes a window of the cover member. In order to remove the pickup cap and put in a CPU package, it is necessary to open the cover member, and then remove the pickup cap from the housing.

U.S. Pat. No. 6,877,990 issued to Liao et al on Apr. 12, 2005 discloses another typical type of LGA socket in which the pickup cap is attached to the cover member, as shown in FIG. 1 and others along with its description. Apparently, since the pickup cap is attached to the cover member, it is not necessary to open the cover member so as to remove the pickup cap, while it can be easily removed without handling a lever and other parts. Other U.S. Pat. Nos. 7,080,986 7,090,517, and 7,059,863 disclose similar pickup of the like.

Chinese Pat No. 03247146.7 issued on Jul. 7, 2004 discloses another typical of LGA socket in which the pick up cap is assembled to the cover member. In the currently design, an embossed portion is formed on a bottom surface of the pickup cap such that once the CPU is disposed within the housing, the CUP can directly eject the pickup cap from the cover member. However, the operator must 1) release the lever; 2) have the cover member wide opened; 3) dispose the CPU into the housing; 4) close the cover member such that the pickup cap is arranged substantially above the CPU; and 5) lock the lever such that the cover member is locked to the metallic reinforcing member, and the pickup cap is then ejected. Still, a lot of jobs need to be done in order to eject the pickup cap through the operation.

Accordingly, there is still a room for improving the existing LGA socket such that the operation of removing the pickup cap can be easily done.

SUMMARY OF THE INVENTION

It is an object of the present invention to provide an improved pickup cap in which can be easily and smoothly removed from a LGA socket when a lever thereof is operated.

In order to achieve the object set forth, a land grid array socket in accordance with the present invention comprises an insulative housing having a plurality of contacts. The insulative housing has a top surface for receiving a land grid array package. A cover member is pivotally mounted on a first end of the insulative housing. The cover member is pivotal between an open position and a closed position where the cover member presses the land grid array package toward the top surface of the insulative housing so that the land grid array package electrically connects to the contacts. A lever is pivotally mounted on a second end of the insulative housing. The lever has a locking portion for locking the cover member in the closed position. A metallic reinforcing plate is positioned on a bottom surface of the housing. The metallic reinforcing plate extends between the first end and the second end of the insulative housing. A pickup cap is attached to the clip, and includes an ejection arrangement interfering with operation of the lever such that when the lever is released from a locked position, the pickup cap can be smoothly ejected by the engagement between the ejection arrangement and the lever.

DESCRIPTION OF PREFERRED EMBODIMENT OF THE INVENTION

Reference will now be made to the drawings to describe the present invention in detail.

Figure 1:
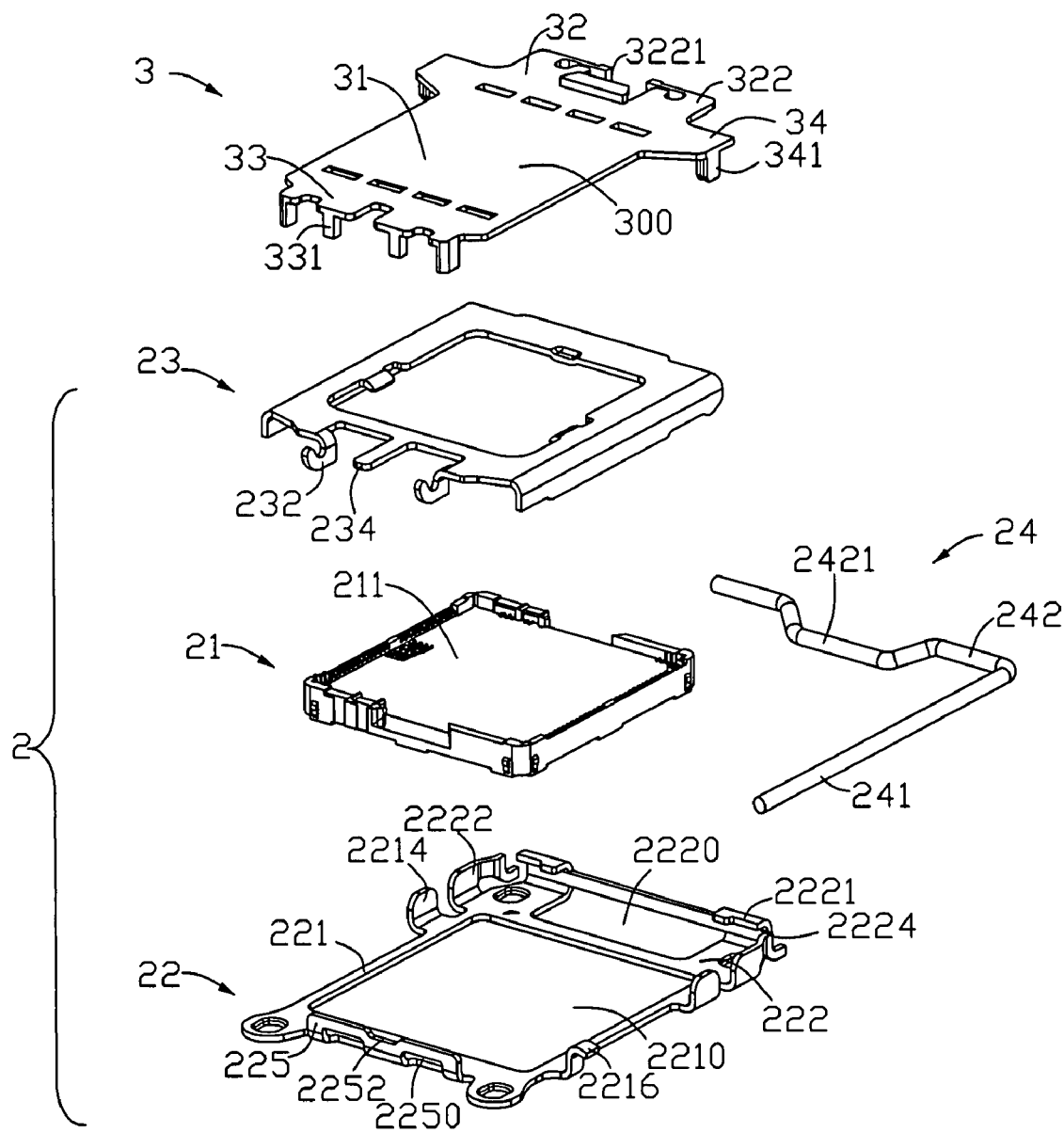
FIG. 1 is an exploded, isometric view of an LGA electrical socket of the present invention which comprising an electrical connector and a pick up cap mounted onto the electrical connector.
Figure 2:
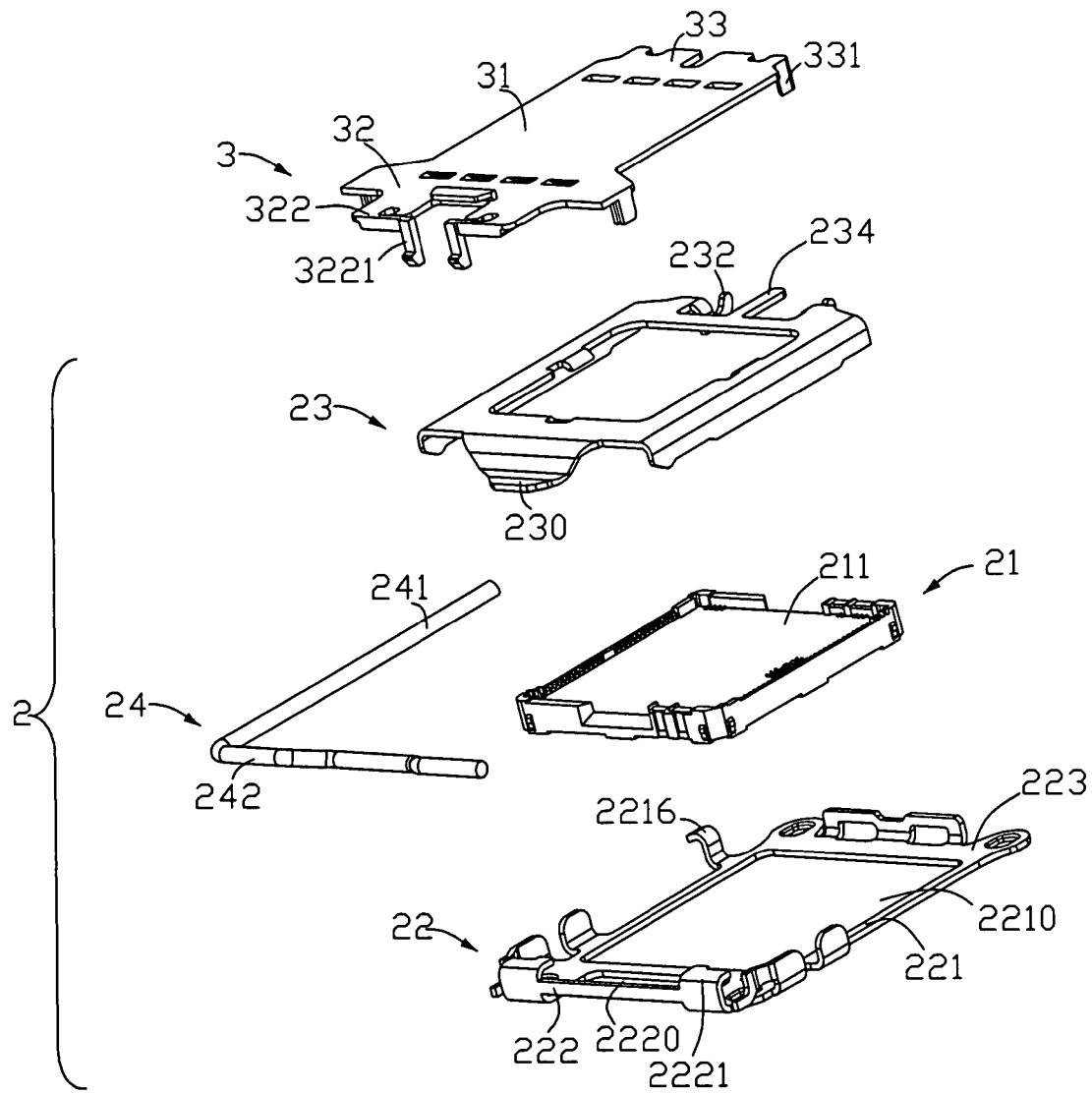
FIG. 2 is a view similar to the FIG. 1, but from another perspective.
Figure 3:
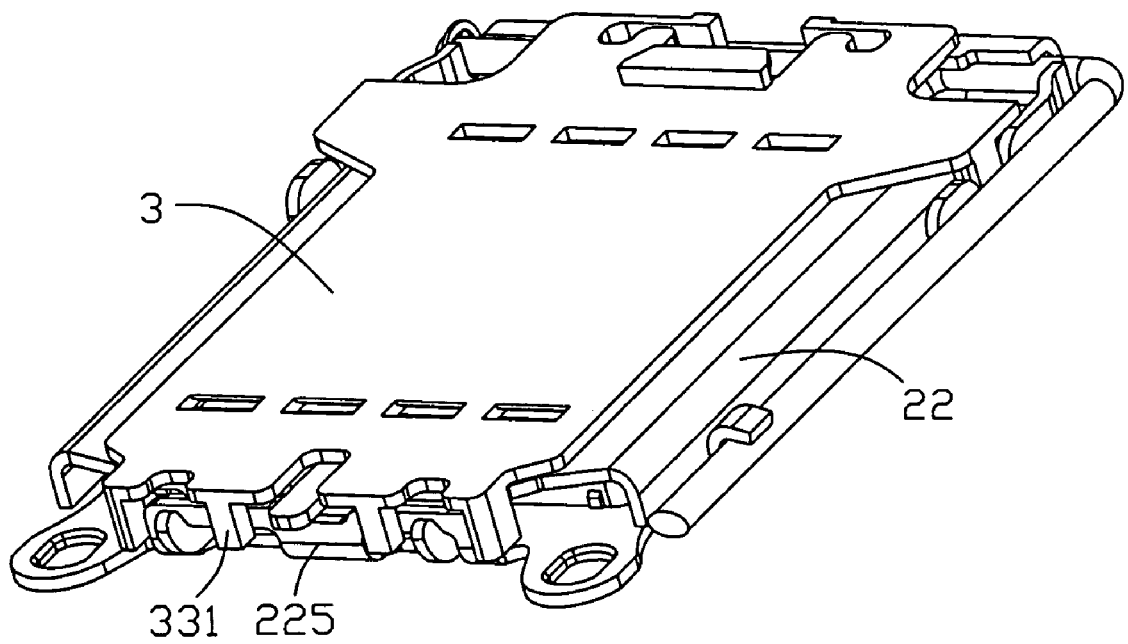
FIG. 3 is an assembled view of an LGA socket of the present invention according to a preferred embodiment.
Figure 4:
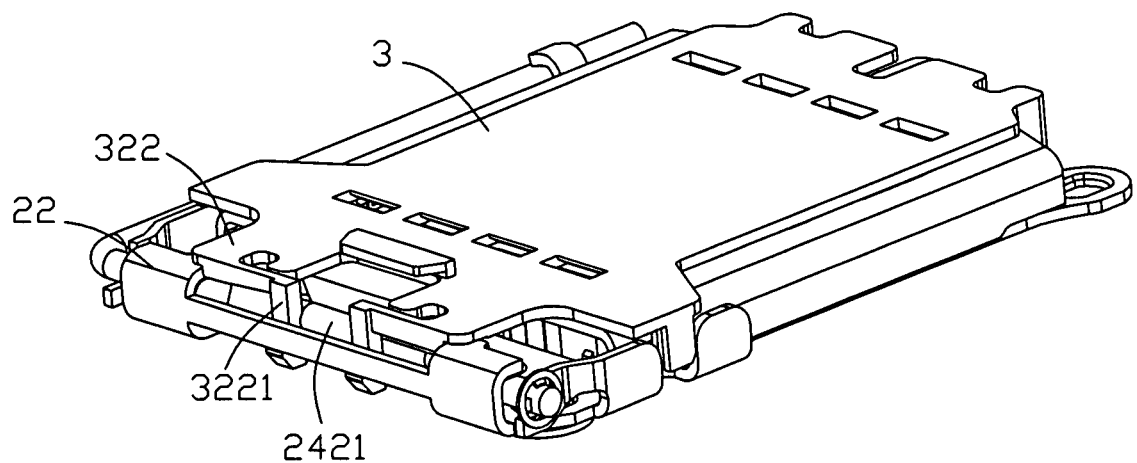
FIG. 4 is a view similar to the FIG. 3, but from another view.

Reference is now made to FIGS. 1-2, the LGA socket assembly in accordance with a preferred embodiment of the present invention comprising a LGA socket 2 for establishing electrical connection between an IC package (not shown) and a substrate circuit, such as a printed circuit board (PCB), and a pick up cap 3 assembled to the LGA socket 2. The pick up cap 3 is mounted onto the connector 2 for provision of a flat top surface facilitating to be sucked by a vacuum suction device, thereby manipulating the LGA connector assembly 1 onto a PCB, where the socket 2 is seated.

The socket 2 comprises a generally rectangular insulative housing 21, a plurality of electrical contacts (not labeled) received in the housing 21, a metal reinforcing plate 22 containing the housing 21 to enforce the housing 21, a retention structure having a lever 24 and a metal clip 23. The lever 24 is pivotally received in an end of the metal reinforcing plate 22, and the metal clip 25 is pivotably mounted to an opposite end of the reinforcing plate 22 for engaging with the lever 24.

The housing 21 defines a generally rectangular cavity 210 in a middle thereof. The cavity 210 is used for receiving an electronic package such as an LGA central processing unit (CPU) (not shown) therein. A multiplicity of passageways (not labeled) is defined in a portion of the housing 21 under the cavity 210, the passageways receiving a corresponding number of the contacts therein respectively.

The metal reinforcing plate 22 comprises a head portion 222, a rear portion 223 and a middle portion 221 defining a rectangular cavity 2210 and connecting the head portion 222 and the rear portion 223. The head portion 222 comprises a pair of U-shaped resistant arm 2221 formed at a front end and each resistant arm 2221 defining a chamber 2224 thereunder, a pair of L-shaped resilience tab 2222 formed at both opposite sides thereof, and a rectangular slot 2220 defined between the resistant arms 2221. The middle portion 221 forms a pair of L-shaped metal ears 2214 at both sides thereof. The rear portion 223 comprises a rear wall 225 defining a pair of spaced slots 2250 thereof. A locating recess 2252 disposed between said slots 2250 forms on the top portion of the real wall 225. The middle portion 221 forms an anchoring portion 2216 at one side thereof near the rear portion 223.

The lever 24 comprises a pair of locating portion 242 pivotally received in the chamber 2324 of the resistant arm 2221 of the metal reinforcing plate 23, an actuating portion 2421 between the locating portions 242, and an operating portion 241 extending from an end of the locating portions 242. The operating portion 241 is disposed at an outside of the metal reinforcing plate 23 and engages with the anchoring portion 2216 when the lever 24 is at a closing position.

The metal clip 23 comprises an engaging portion 230 extending arcuately from an end thereof, a pair of spaced securing portions 232 extending arcuately from an opposite end thereof corresponding to the slots 2220 of the metal reinforcing plate 22, and a tail 234 between the securing portions 232. The securing portions 232 are pivotally received in the slots 2320 of the metal reinforcing plate 22. When the clip 23 is oriented at a horizontal position parallel to the top face of the housing 21, the engaging portion 230 of the clip 23 engages with the actuating portion 2421 of the lever 24 for pressing the CPU toward the contacts. When the clip 23 is oriented at a position perpendicular to the top face of the housing 21, the tail 234 abuts against the metal reinforcing plate 22 to prevent the clip 23 from being over-rotated.

The pick up cap 3 has a planar body 30 comprising a smooth flat top surface 300 and a bottom surface 301 opposite to the top surface 300, a front end 32 and a rear end 33 between two side of the planar body 30 respectively. The front end 32 comprises an extending portion 322 extending from planar body 30. The extending portion 322 forms a pair of hooks 3221 at both sides thereof for engaging with edge of the slot 2220. A plurality of clasps 331 engagable with the slots 2350 of the metal reinforcing plate 22 is formed at end of rear end 23 of the pick up cap 3 for securing the pick up cap 3 and LGA connector assembly. The extending portion 322 defines a pair of small wings 34 each having a clasp 341 extending therefrom toward the metal clip 23.

Referring to FIGS. 1-4, in assembly process, the contacts are pre-loaded within the insulative housing 21. The insulative housing 21 is then received in the metal reinforcing plate 22. The locating portions 242 of the lever 24 are pivotally received in the chambers 2224 of resistant arms 2221 of the reinforcing plate 22. The securing portions 252 are pivotally received in the slot 2350 of the metal reinforcing plate 22. When the metal clip 23 is at a closing position, the engaging portion 230 of the metal clip 23 is arranged above the rectangular slot 2220 of the head portion 222. The actuating portion 242 of the lever 24 presses the engaging portion 230 of the metal clip 23, and the operating portion 241 of the lever engages with the anchoring portion 2216 for locating the lever 24 at the closing position. Then, the pick up cap 3 is disposed above the clip 23. The hooks 3221 engage with the edge of the rectangular slot 2220 of the metal reinforcing plate 22, the claps 331 engaging with upper portion of the slot 2250 of the rear wall 225. Finally, the LGA socket is assembled together, the extending portion 322 of the pick up cap 3 being arranged above the actuating portion 2421 so as to form an ejection arrangement interfering with the lever 24.

Figure 5:
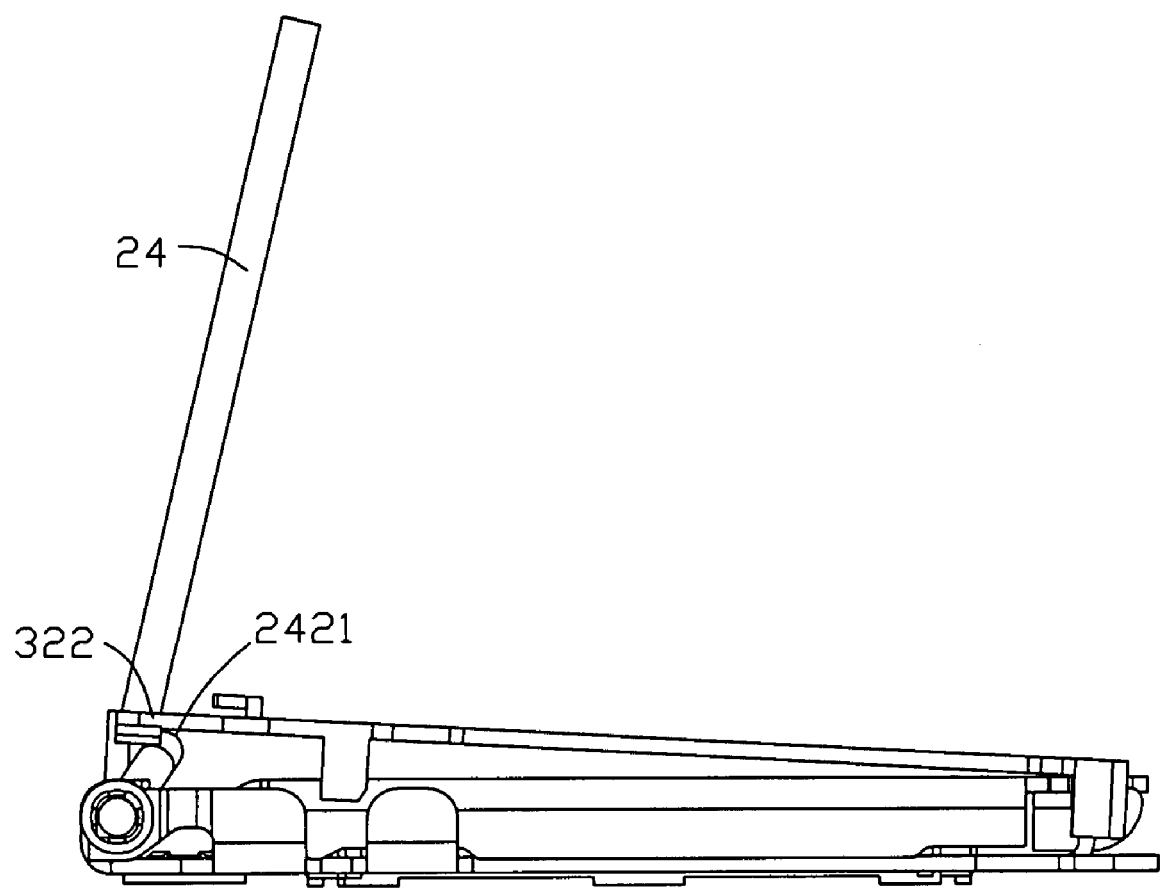
FIG. 5 is an assembled view of the present invention, showing a pick up cap to be ejected when a lever is lifted from a closed position to an position.
Figure 6:
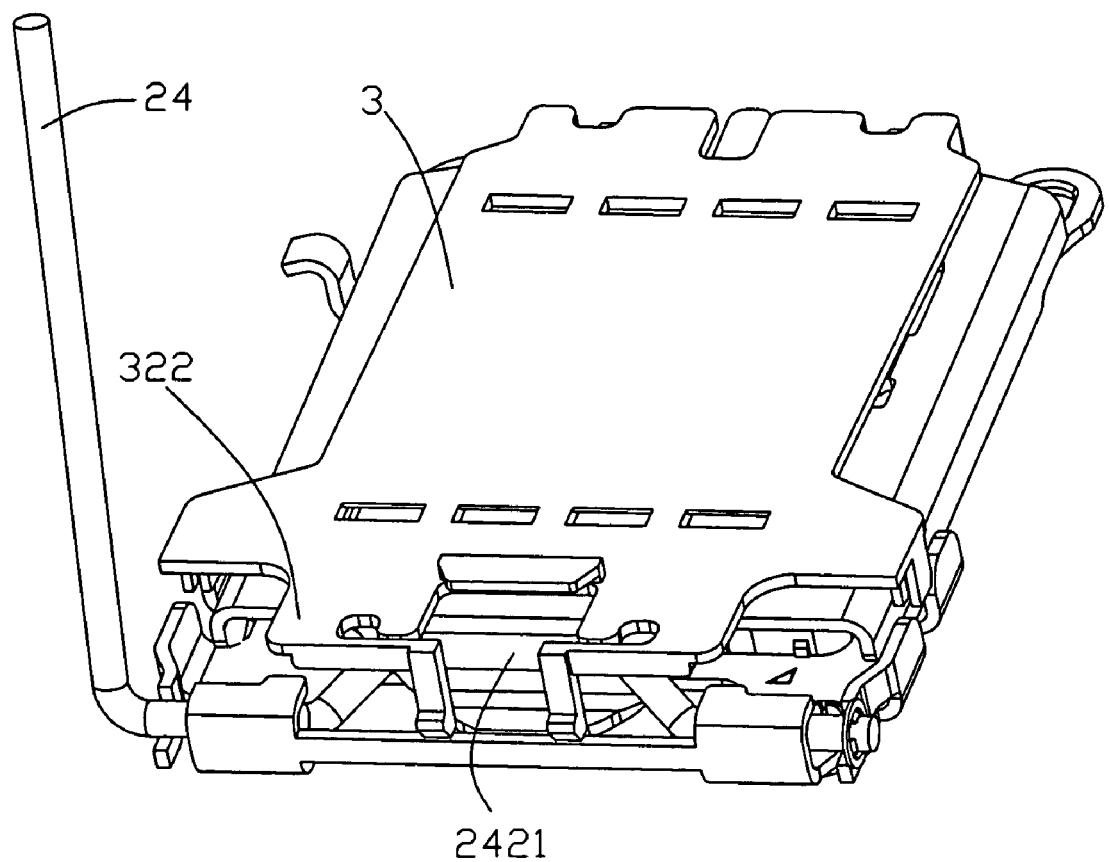
FIG. 6 is a view similar to the FIG. 5, but from another perspective.

Reference is now made to FIGS. 5-6, as appreciable from the foregoing description, the pick up cap 3 of the LGA connector assembly being disposed above the metal clip 23 and including an ejection arrangement interfering with operation of the lever 24 such that when the lever 24 is released from a locked position, the pickup cap 3 can be smoothly ejected by the engagement between the ejection arrangement and the lever 24. Thus, during detaching the pick up cap 3 onto the connector 2, the pick up cap are likely to be removed automatically by the operation of the lever 24 without additional manual operation.

It is need to be noted, both ends of the pick up 3 in according with the preferred embodiment of the present invention is attached to the metal reinforcing plate 22. Also, when the both ends of the pick up cap 3 is attached to the metal clip 3, the pick up cap can be removed automatically by the lever 24 as long as the pick up cap 3 includes an ejection arrangement interfering with operation of the lever 24. Additionally, when the pick up cap 3 is attached to the front end 222 of metal reinforcing plate 22 and attached to an end of the clip 23, which is close to the rear end 223 of the metal reinforcing plate 22 or opposite case, the pick up can be removed automatically by the lever 24 as long as the pick up cap 3 includes an ejection arrangement interfering with operation of the lever 24.

Although the present invention has been described with reference to a particular embodiment, it is not to be construed as being limited thereto. Various alterations and modifications can be made to the embodiment without in any way departing from the scope or spirit of the present invention as defined in the appended claims

I claim:

1. A land grid array (LGA) socket assembly, comprising:
   an insulative housing having a plurality of contacts, the insulative housing having a top surface for receiving a land grid array package;
   a metallic reinforcing plate disposed around the insulative housing;
   a clip pivotally mounted on a first end of the metallic reinforcing plate, the clip being pivotal between an open position and a closed position where the clip presses the land grid array package toward the top surface of the insulative housing so that a land grid array package electrically connects to the contacts; and
   a lever pivotally mounted on a second end of the metallic reinforcing plate, the lever having a locking portion for locking the clip in the closed position; and
   a pickup cap being disposed above the clip and attached to said metal reinforcing plate, and including an ejection arrangement interfering with operation of the lever such that when the lever is released from a locked position, the pickup cap can be smoothly ejected by the engagement between the ejection arrangement and the lever.

2. The LGA socket assembly as recited in claim 1, wherein the ejection arrangement is arranged at a side of the pickup cap.

3. The LGA socket assembly as recited in claim 1, wherein the ejection arrangement is close to the second end of the metallic reinforcing plate in which the lever is pivotally mounted.

4. The LGA socket assembly as recited in claim 1, wherein the pick up cap is attached to the second end of metal reinforcing plate and attached to an end of the clip, which is close to the first end of the metal reinforcing plate.

5. A land grid array (LGA) socket assembly, comprising:
an insulative housing having a plurality of contacts, the insulative housing having a top surface for receiving a land grid array package;
a metallic reinforcing plate disposed around the insulative housing;
a clip pivotally mounted on a first end of the metallic reinforcing plate, the clip being pivotal between an open position and a closed position where the clip presses the land grid array package toward the top surface of the insulative housing so that a land grid array package electrically connects to the contacts; and
a lever pivotally mounted on a second end of the metallic reinforcing plate, the lever having a locking portion for locking the clip in the closed position; and
a pickup cap being disposed above and attached to the clip and including an ejection arrangement interfering with operation of the lever such that when the lever is released from a locked position, the pickup cap can be smoothly ejected by the engagement between the ejection arrangement and the lever;
wherein the lever comprises an actuating portion, which can turns between a closed position and an open position, for locating the clip in the closed portion; and the pick up cap comprises an extending portion from one end of the pick up cap above the actuating portion.

6. An LGA connector assembly comprising:
a connector including:
an insulative housing defining an upward receiving cavity;
a plurality of contacts disposed in the housing with contacting sections upwardly extending into the receiving cavity;
a clip pivotally mounted around one end of the housing and positioned upon the housing;
a lever pivotally mounted around the other end of the housing and having an engagement section engageably locking the clip in position; and
a pick up cap positioned upon the connector; wherein
the lever defines a pivotal movement path when said lever is moved from a horizontal position to a generally upstanding position, and said pivotal movement path interferes with the pick up cap so as to assure the pick up cap will leave away from the housing once the clip is released from the lever during loading an electronic package into the receiving cavity; wherein
said lever includes a shaft portion essentially extending along a transverse direction of the housing, and a handle portion moveable in a vertical plane, and an interference between the pick up cap and the lever occurs at the shaft section.

7. The LGA connector assembly as claimed in claim 6, wherein said engagement section is formed on said shaft section, where said interference occurs.

8. The LGA connector assembly as claimed in claim 6, wherein an interference between the pick up cap and the lever occurs at one end of the pick up cap.

9. The LGA connector assembly as claimed in claim 6, where the pick up cap is lifted by the lever with a distance close to a vertical thickness of the connector when the lever is moved from the horizontal position to the generally upstanding position.

10. The LGA connector assembly as claimed in claim 6, wherein said engagement section defines a crank configuration thereof.

11. The LGA connector assembly as claimed in claim 6, wherein a metallic reinforcing plate is attached on a bottom of the housing.

12. The LGA connector assembly as claimed in claim 11, wherein at least one of said clip and said lever is mounted upon the reinforcing plate.

* * * * *